United States Patent [19]
Kitamura et al.

[11] 4,279,005
[45] Jul. 14, 1981

[54] METHOD AND SYSTEM FOR AUTOMATICALLY PROVIDING FLAT FREQUENCY RESPONSE TO AUDIO SIGNALS RECORDED ON MAGNETIC TAPES

[75] Inventors: Masatsugu Kitamura; Hideo Onoye; Masami Yamazaki, all of Yokohama, Japan

[73] Assignee: Victor Company of Japan, Limited, Yokohama, Japan

[21] Appl. No.: 41,822

[22] Filed: May 23, 1979

[30] Foreign Application Priority Data

| May 28, 1978 | [JP] | Japan | 53-63609 |
| Jun. 10, 1978 | [JP] | Japan | 53-70066 |
| Jul. 23, 1978 | [JP] | Japan | 53-89611 |

[51] Int. Cl.³ .......................... G11B 5/47; G11B 5/45; G11B 77/36
[52] U.S. Cl. ........................ 360/66; 360/31; 360/65
[58] Field of Search ................... 360/65–68, 360/31

[56] References Cited

U.S. PATENT DOCUMENTS

| 4,011,585 | 3/1977 | Sunaga | 360/65 |
| 4,037,259 | 7/1977 | Hammon et al. | 360/66 |
| 4,038,692 | 7/1977 | Umeda et al. | 360/65 |
| 4,092,678 | 5/1978 | Nishikzwa | 360/66 |

OTHER PUBLICATIONS

Technical Information Brochure #4 by Clarence Stanley, Ampex Corp., Mar. 15, 1958, pp. 1-8.

*Primary Examiner*—Vincent P. Canney
*Attorney, Agent, or Firm*—Lowe, King, Price and Becker

[57] ABSTRACT

In order to compensate for differences in magnetic properties of recording tapes, a first and second audio test signals of different frequencies are generated by a variable frequency test signal source, recorded on a magnetic tape and reproduced to represent the magnetic properties of the tape at the different frequencies. The reproduced first test signal is stored in a microcomputer for comparison with the level of the subsequently reproduced second test signal to detect the difference therebetween for making an adjustment of the level of the second test signal in accordance with the detected difference through the use of a level adjusting device. The latter is thereafter held adjusted to the value at which the two test signals have an equal level of reproduction.

21 Claims, 11 Drawing Figures

METHOD AND SYSTEM FOR AUTOMATICALLY PROVIDING FLAT FREQUENCY RESPONSE TO AUDIO SIGNALS RECORDED ON MAGNETIC TAPES

BACKGROUND OF THE INVENTION

The present invention relates to automatic adjustment of frequency response characteristics of a tape recorder for providing a flat response to audio signals recorded in the tape.

It is known that magnetic recording tapes exhibit different magnetic characteristics due to slight differences in material coated on the base of the tape. Due to the different magnetic characteristics, optimal bias level and frequency response characteristics also differ between tapes. The different characteristics require the user to adjust the bias level and equalizer characteristics of the tape recorder whenever the recording tape is replaced. Automatic bias level setting is accomplished in a manner as disclosed in copending United States Patent Application Ser. No. 24,875, filed Mar. 28, 1979, now U.S. Pat. No. 4,220,979 which the bias level is swept across in a given range and recorded in a tape prior to an actual recording operation. The recorded bias is reproduced to determine the optimal level which minimizes waveform distortion.

Although the distortion factor may be reduced to a minimum, the different signal level and frequency characteristics are still reflected in the reproduced signal. If the tape recorder is provided with a noise reduction system having nonlinear compression-expansion characteristics the replacement of tapes would result in a deviation of the actual characteristic from the desired one, and hence a loss of faithful reproduction.

SUMMARY OF THE INVENTION

Accordingly, an object of the invention is to compensate for differences in the recording characteristics of magnetic tapes by automatically adjusting the frequency response characteristic of the tape recording apparatus using at least two test signals of different audio frequencies.

The invention contemplates the use of a first audio test signal at a first frequency which is recorded on the tape being tested prior to actual recording. The first signal is reproduced and reproduction level is detected to sense the characteristic of the tape at the first frequency. The detected signal is recorded in a storage medium. A second audio test signal at a second frequency is subsequently recorded on the same tape. The second signal is reproduced and the reproduced signal level is detected to sense the characteristic of the tape at this second frequency. The level of the second signal is then compared with the stored level of the first signal to detect the difference between them. The second test signal is adjusted in level by means of a level adjusting device to an optimum value in accordance with the detected difference so that the second signal reaches the same level as the first signal. The level adjusting device is held adjusted at this optimum value during the period of the actual recording, so that it provides a flat response to recording signals over the audio frequency spectrum.

In a first preferred embodiment of the invention, first and second level adjusting devices are employed for making individual adjustments of the level of the first and second test signals. A programmed microcomputer sets the first level adjusting device to a point which reduces the first test signal to a minimum, so that the first test signal is recorded initially at a minimum level. The level of the first test signal is then increased by adjusting the first level adjusting device until a given level, stored in the microcomputer, is reached. Although this given level is constant, differences in recording tapes result in the first level adjusting device being adjusted to different settings in accordance with the sensed magnetic characteristic of the tape at the first frequency. The first level adjusting device is maintained at the setting value which corresponds to the stored level of the first test signal. The second test signal is then recorded at a minimum level through a second level adjusting device and reproduced. The reproduced second test signal is compared with the stored level of the first signal to provide a difference signal which controls the second level adjusting device until the difference substantially reduces to zero.

Since it is known that the bias response characteristic of the recording tape differs between audio frequencies for a given bias level, a second preferred embodiment utilizes this characteristic as a means for varying the level of a high frequency test signal as a function of bias level relative to a stored value of a low frequency test signal until the two test signals reach a same recording level.

BRIEF DESCRIPTION OF THE DRAWINGS

The invention will be further described by way of example with reference to the accompanying drawings, in which.

DETAILED DESCRIPTION

Figure 1:
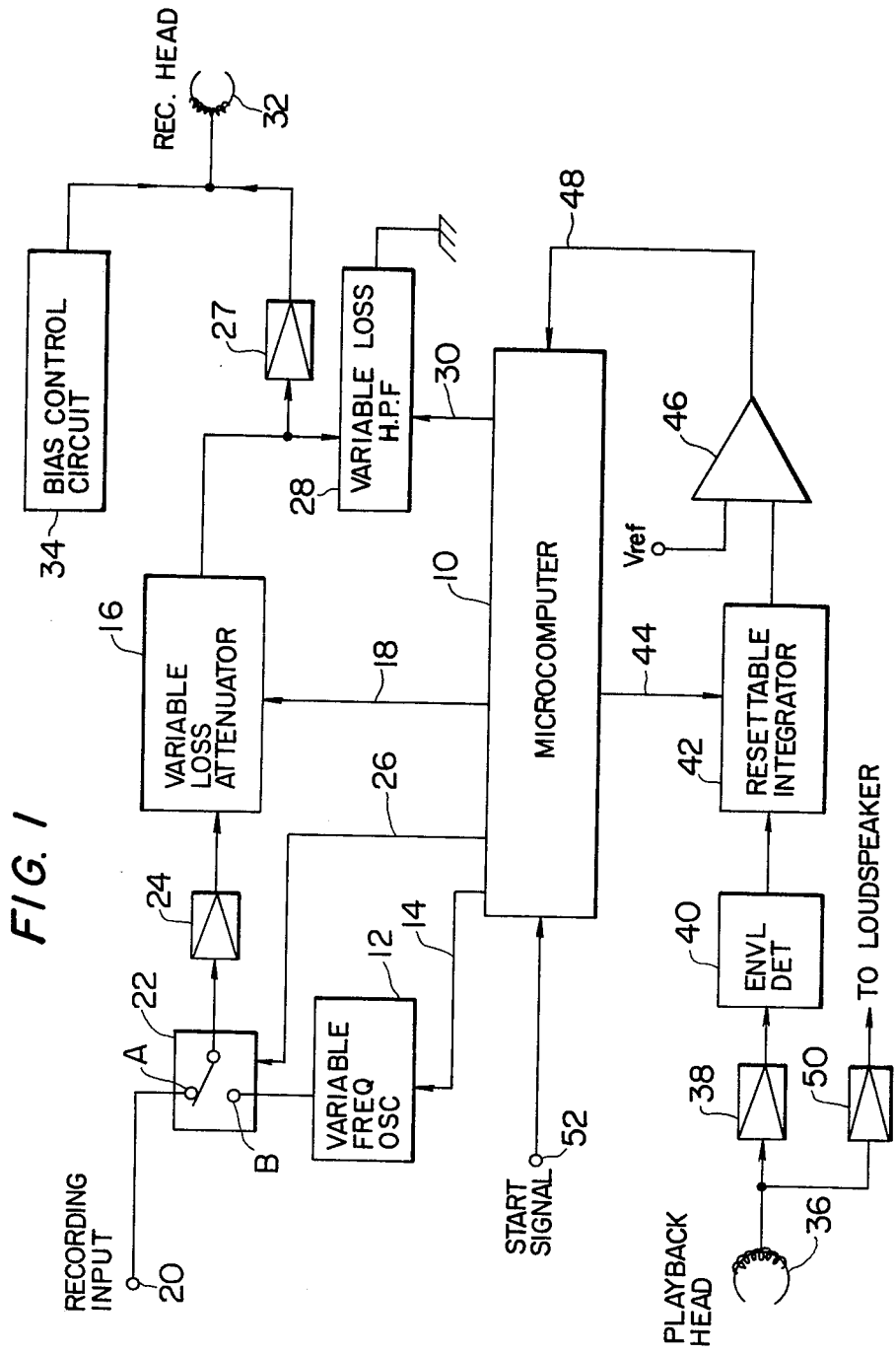
FIG. 1 is a schematic diagram of a first preferred embodiment of the invention.

Referring now to FIG. 1, a first preferred embodiment of the present invention is illustrated as comprising a microcomputer 10 of conventional design. Microcomputer 10 is programmed in a manner described in detail hereinafter. A test signal source in the form of variable frequency oscillator 12 responds to command signals supplied by microcomputer 10 to lead 14 to derive a low frequency test signal in the low frequency region of the audio spectrum, typically at 1 kHz, or a high frequency test signal in the high frequency region of the spectrum typically at 10 kHz. A digital variable loss attenuator 16 is provided to impart a discrete value of attenuation to an input signal in accordance with digital signals supplied to it from the computer 10 on lead 18. The input signal to the attenuator 16 is supplied from a recording input 20 through a changeover switch 22 and a linear amplifier 24, or supplied from the test signal source 12 through switch 22. The recording input signal is applied to the attenuator 16 when the switch 22 is in the A contact position during a subsequent recording operation, and the test signal is applied to the attenuator 16 when switch 22 is in the B position in response to a command signal from the micro computer supplied on lead 26 during the test mode. The output of the attenuator 16 is connected to the input of a variable loss high-pass filter 28 and to the recording head 32 through an amplifier 27. Filter 28 provides a bypass to ground for signals in the high frequency region of the audio spectrum to adjust the level of the high test frequency signal to the level of the low frequency test signal according to digital command signals supplied on lead 30 from the microcomputer. To the recording head 32 is also supplied a bias signal, typically at 100 kHz, from a bias control circuit 34. During the test mode the low and high frequency test signals are successively recorded on tape and picked up by the playback head 36 and through an amplifier 38 applied to an envelope detector 40 and thence to a resettable integrator 42. Integrator 42 is reset in response to a command signal supplied from the computer on lead 44 to provide linear integration of the envelope detected test signal to generate a sawtooth wave voltage. A comparator 46 receives the output of integrator 42 for comparison with a voltage reference (V ref) to deliver an output signal to microcomputer 10 through lead 48 when the instantaneous value of the sawtooth voltage reaches the reference voltage.

During the subsequent recording mode, an audio recording signal applied to input terminal 20 and recorded on tape through attenuator 16 and amplifier 27 is picked up by the playback head 36 and applied through an amplifier 50 to a loudspeaker (not shown).

Figure 4:
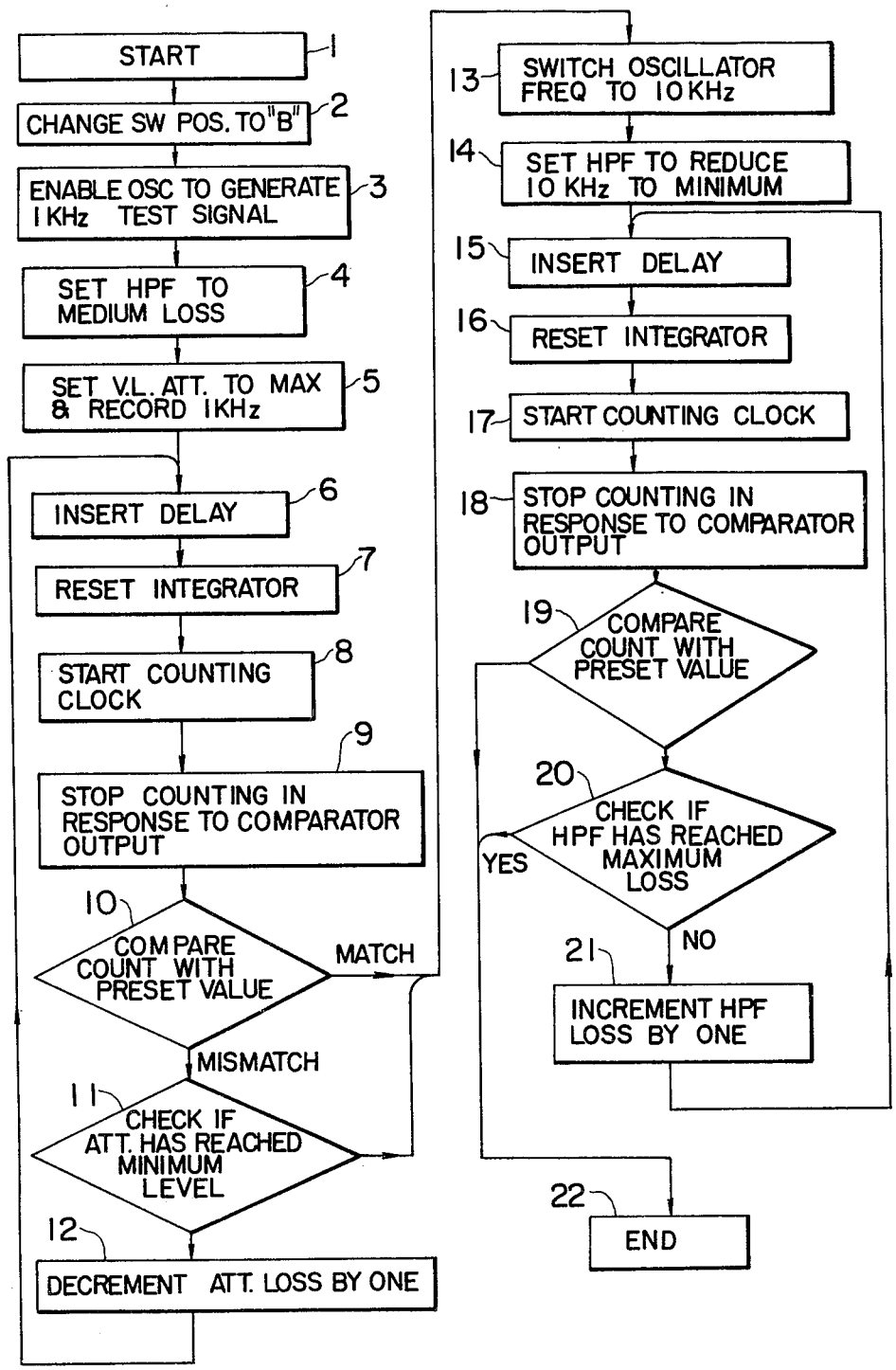
FIGS. 4 and 5 are flow charts associated with the FIG. 1 embodiment.

The operation of the circuit of FIG. 1 will be clearly understood with reference to the flow chart shown in FIG. 4. The microcomputer 10 is responsive to a test mode enable signal applied to terminal 52 during step 1 to change the, position of switch 22 from the illustrated condition on terminal A to terminal B during step 2. In step 3 an enable signal is supplied to the test signal source 12 to generate a 1 kHz test signal sinusoidal waveform of constant amplitude. Computer 10 sets the highpass filter 28 to a medium value of attenuation in step 4 and then proceeds to step 5 in which it sets the attenuator 16 to a maximum value of attenuation whereby the 1 kHz test signal is initially recorded on the tape at a minimum level along with the bias signal supplied from circuit 34. The microcomputer 10 then introduces a delay interval in step 6 to allow the recorded portion of the tape to reach the playback head 36 and at the termination of the delay interval (step 7) resets the integrator 42 and commences counting clock pulses (step 8) supplied from a built-in clock source. Since the frequency response characteristic of the recording tape is reflected in amplitude variations in the recorded signal across the audio spectrum, the reproduced signal also varies in amplitude and this amplitude variation is detected by the envelope detector 40 and applied to the integrator 42. Since the integrated voltage increases as a function of the input voltage level, the output signal from the integrator 42 is representative of the frequency response characteristic of the tape being tested at 1 kHz. Therefore, the output signal from the comparator 46 occurs at intervals which are inversely proportional to the integrator output signal and hence inversely proportional to the reproduced signal level. In step 9, microcomputer 10 terminates the counting operation in response to the output from the comparator 46, so that the count is a measure of the inverse function of the reproduced signal level at 1 kHz. Microcomputer 10 is programmed to proceed to step 10 in which it compares the count value with a preset value which is chosen to correspond to a recording level of a standard tape and proceed to step 11 if the count value is greater than the preset value or proceed to step 13 if the count value is equal to or smaller than the present value. That is, if the reproduced signal is smaller than the preset value, the computer proceeds to step 11 to repeat the aforesaid procedures and if the reproduced signal is equal to or greater than the preset value, the computer proceeds to step 13.

In step 11 the computer compares the instantaneous value of attenuation with the minimum value of attenuation, which the attenuator 16 can provide, in order to check to see of the latest value of attenuation has reached the minimum value; if so computer 10 proceeds to step 13 and if not it proceeds to step 12. In step 12 the computer gives a command signal to the variable loss attenuator 16 to decrement its attenuation by a discrete amount, so that the level of the recorded 1 kHz test signal is increased by one discrete value. Steps 6 to 10 are then repeated to stepwise increment the recording level until the reproduced signal reaches the preset value. When this occurs the attenuator 16 is held to the latest setting value. This setting value may differ from that of the standard tape by an amount corresponding to the deviation of the frequency response at 1 kHz of the tape now under test from the standard tape.

In step 13, the microcomputer 10 instructs the oscillator 12 to change its frequency to 10 kHz. The 10 kHz test signal undergoes the same attenuation as the low frequency test signal and enters the variable loss highpass filter 28 through which the high frequency test signal is passed to ground.

In step 14, the highpass filter 28 is set to a minimum loss so that the level of high frequency testsignal is initially adjusted to a minimum level. The microcomputer then proceeds to step 15 to insert a delay interval, as in step 6 and further to steps 16 to 18 in succession, which respectively correspond to steps 7 to 9. Therefore, in step 18 the computer stores a count which represents the level of reproduced high frequency test signal. This stored count is then compared with the preset value in step 19 to detect the difference between them as is done in step 10 with respect to the low frequency test signal. In step 20, the microcomputer 10 checks to see if the latest value of the highpass filter loss has reached its maximum value; if so computer 10 proceeds to step 22 to terminate the test procedure; if not computer 10 proceeds to step 21 to increment the loss injected by filter 28 by one discrete value. Computer 10 then returns to step 15 to repeat the above process until the level of the high frequency test signal reaches the preset value to which the low frequency test signal is also adjusted, whereupon the variable loss high filter 28 is held to the latest value. Therefore, the audio test signals both in the low and high frequency regions of the spectrum are adjusted to the same signal level by the settings of attenuator 16 and highpass filter 28. With these adjustments the system is ready to provide flat frequency response when switch 22 is brought to the A position during the recording mode.

Figure 5:
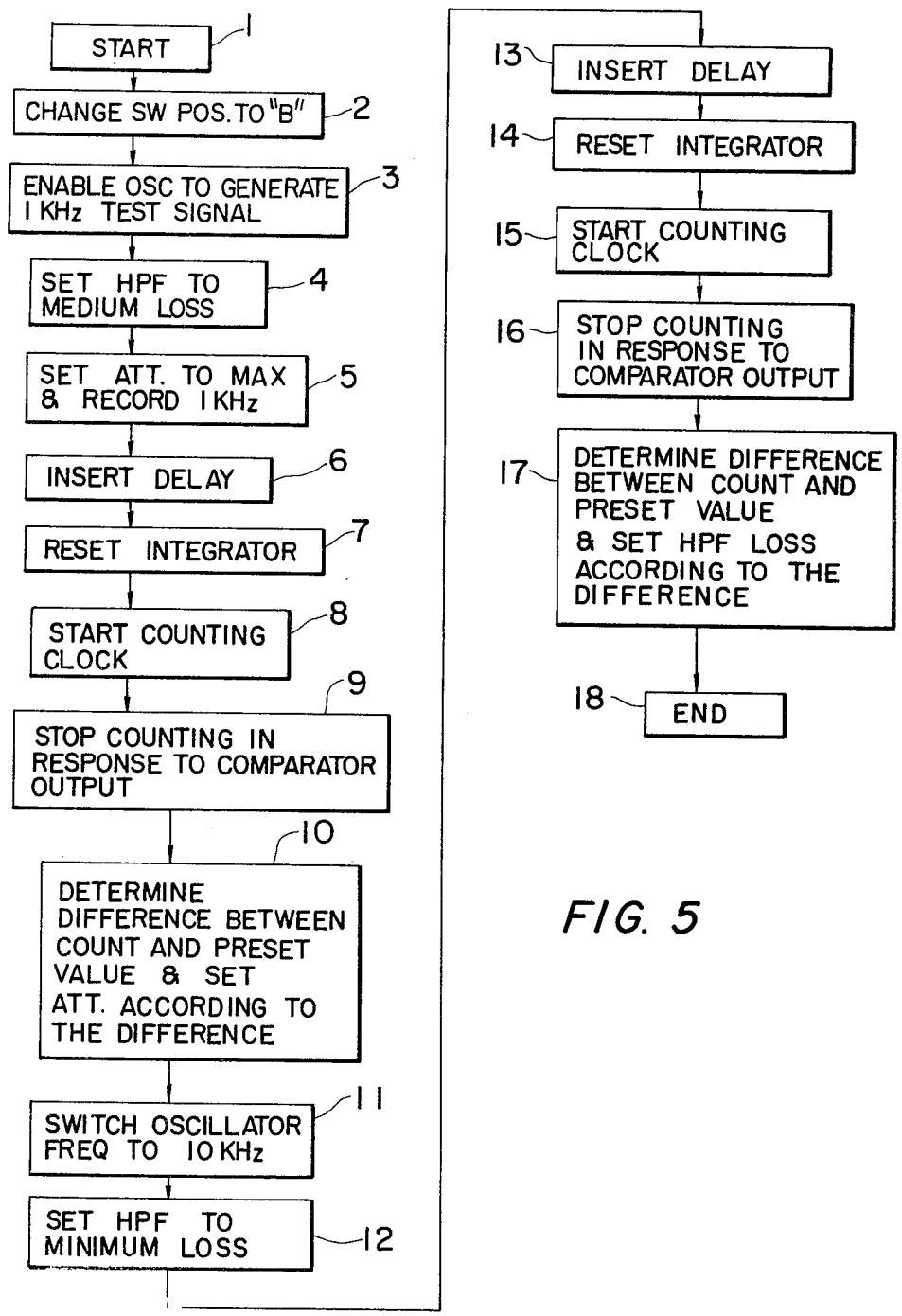

Alternatively, the microcomputer 10 may also be programmed to proceed step 11 through 18 of FIG. 5 which is generally similar to the steps of FIG. 4 with the exception that in step 10 the computer is programmed to determine the difference between the count value of step 9 and the preset value and, based on this difference data, instantly sets the attenuator 16 to a point which provides a recording level corresponding to the preset value. Therefore, the steps 11 and 12 of FIG. 4 are dispensed with, so that steps 11 through 16 correspond respectively to steps 13 through 18 of FIG. 4. Likewise, instead of steps 19 to 21 of FIG. 4, computer 10 performs in step 17 the determination of the difference between the stored count in step 16 and the preset value. Based on this data, computer 10 instantly sets the loss of highpass filter 28 to a point which provides a reproduction level corresponding to the preset value.

The bias control circuit 34 may comprise a bias signal source for generating a 100 kHz constant amplitude signal. However, it is preferable that the amplitude of this bias signal be adjusted in accordance with the particular magnetic properties of the tape being used to give an optimal bias level as disclosed in the aforesaid copending United States Patent Application in which the bias level is automatically adjusted using a test signal prior to the recording of actual audio signals.

Figure 10:
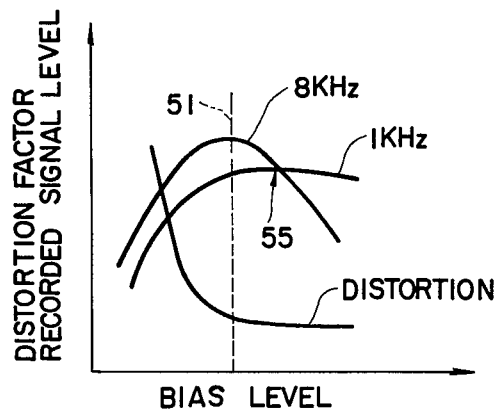
FIG. 10 is a graphic representation of the bias response characteristics of the magnetic recording tape useful for describing the operation of the FIG. 2 embodiment.

Signals in the high frequency region of the audio spectrum can alternatively be modified as a function of the magnitude of bias signal. As illustrated in FIG. 10 the reproduced signal level of a low frequency signal at 1 kHz increases as a function of bias level until it reaches a certain level indicated by broken lines 51 whereupon the 1 kHz signal remains at a level which can be considered practically constant for applications where precise adjustment is not required. On the other hand, the level of reproduced high frequency signal, typically at 8 kHz, decreases as a function of the bias level. The distortion factor is also plotted against the bias signal, which indicates that for bias signals exceeding the threshold level 51 the distortion factor remains at a considerably low constant value. Therefore, it will be understood that the high frequency component of the audio signal can be modified in amplitude as a function of bias level, while keeping the low frequency audio signal at a substantially constant level.

Figure 2:
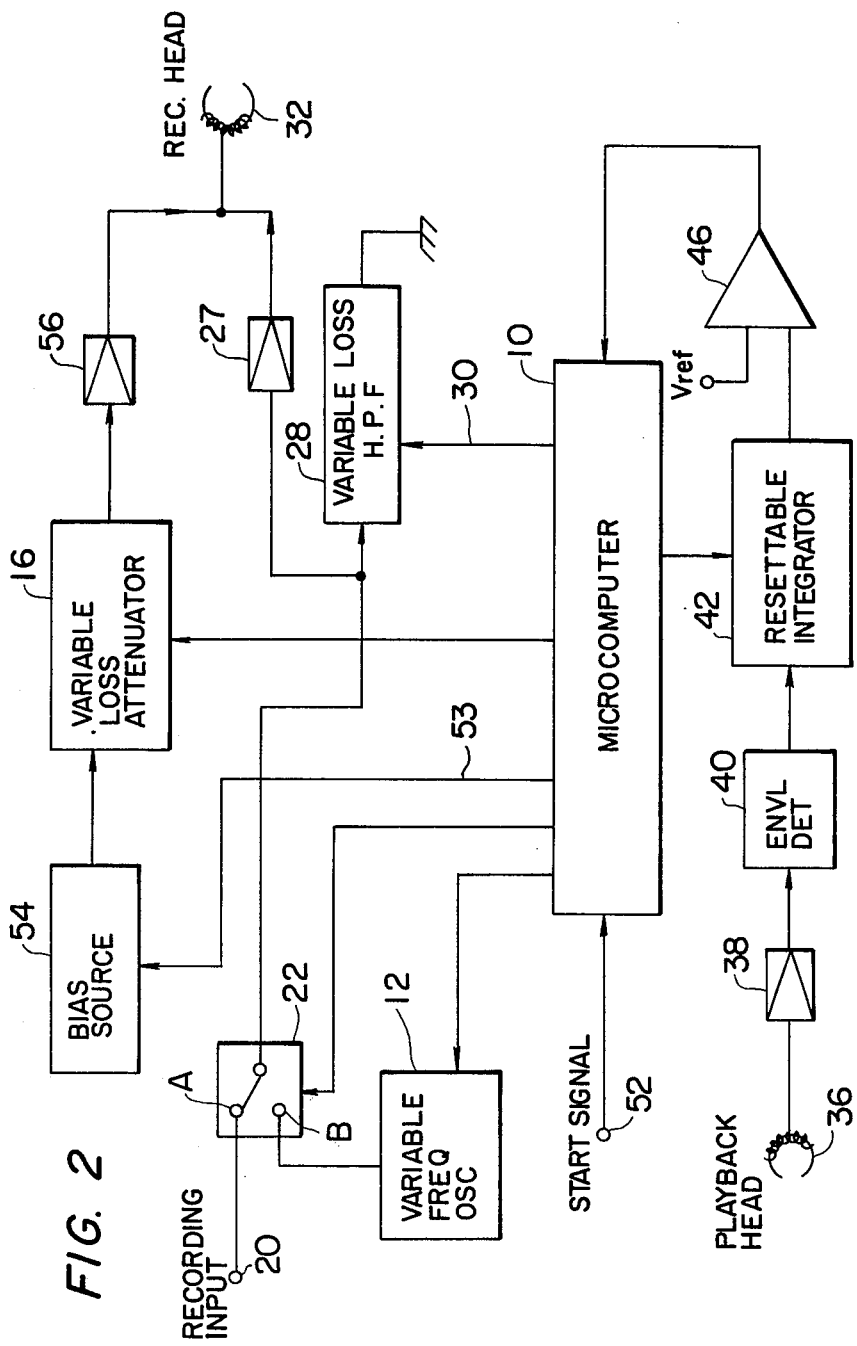
FIG. 2 is a schematic diagram of a second preferred embodiment of the invention.

The circuit shown in FIG. 2 embodies an alternative embodiment for controlling the amplitude of the high frequency audio signal to conform it with the lower frequency signal level. This embodiment is generally similar in configuration to that of FIG. 1 except that (1) the bias control circuit 34 is replaced with a circuit 54 which delivers a constant amplitude bias signal at 100 kHz to the variable loss attenuator 16, having an output connected to the recording head through amplifier 56 and (2) the audio test signal is applied directly to the variable loss highpass filter 28 and to the recording head through amplifier 27. In this embodiment, the variable attenuator 16 is automatically set to a level which causes the bias level to correspond to a standard value which lies to the right of the threshold level 51 in FIG. 10; thereby microcomputer 10 can detect the level of the correspondingly reproduced low frequency test signal and store the reproduced low frequency signal. The attenuator 16 is subsequently adjusted to give a maximum bias level which is then decreased in step so that the magnitude of the high frequency test signal increases as a function of the decreasing bias until it reaches the same level as the low frequency test signal.

Figure 6:
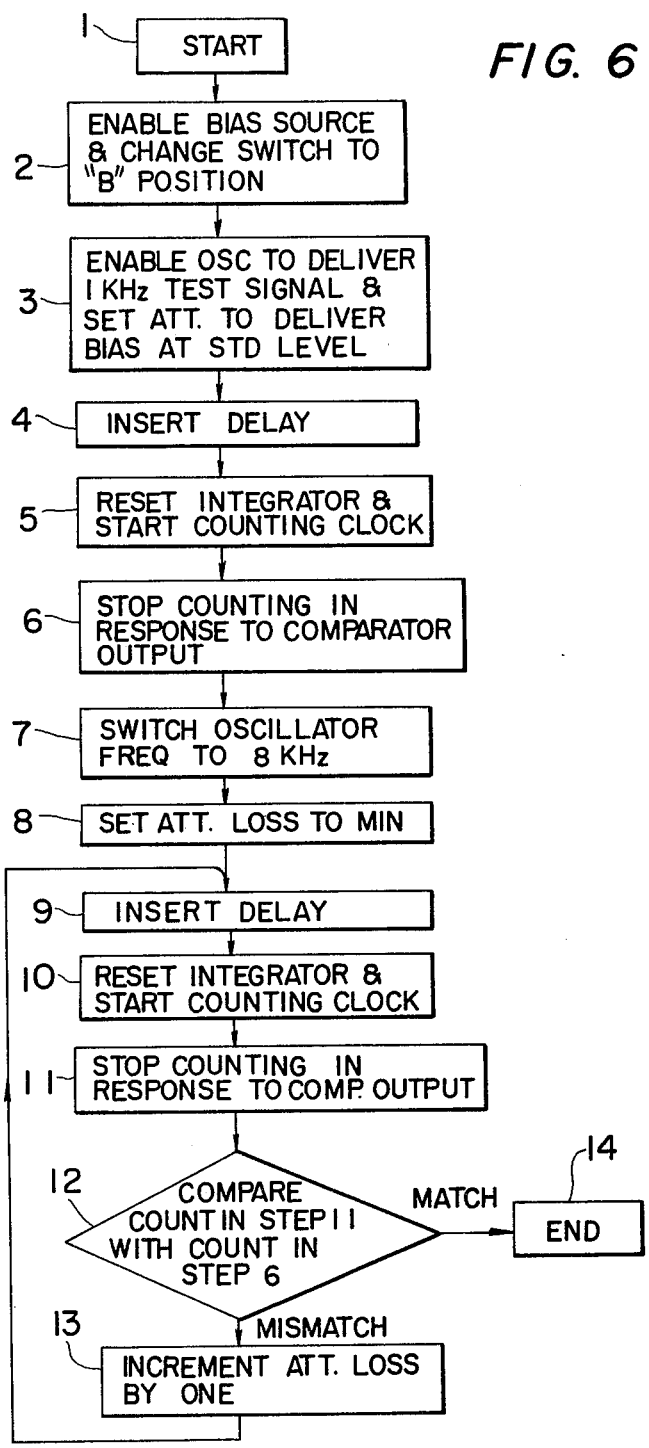
FIGS. 6, 7 and 8 are flow charts associated with the FIG. 2 embodiment.

FIG. 6 is an illustration of the test procedure associated with the embodiment of FIG. 2. In step 2, the bias source 54 is enabled in response to a signal on lead 53 from computer 10 in step 3 the oscillator 12 is controlled to deliver a 1 kHz test signal and the attenuator 16 is adjusted to insert a loss which gives the standard bias level for magnetic tapes. In step 4 a delay interval is introduced to allow the integrator 42 to start integration in step 5, immediately after the recorded portion of the tape reaches the playback head. At the same time a clock counting operation is commenced, in step 6 the counting operation is terminated in response to a signal from the comparator 46. The count value is then stored in the microcomputer 10 as a reference for later use.

In step 7, the oscillator 12 frequency is switched to 8 kHz and then in step 8 the attenuator 16 loss is switched to a minimum level to give a maximum bias, so that upon recording the high frequency test signal is superimposed with a maximum bias. Therefore, the level of the reproduced high frequency test signal is initially at relatively low level (FIG. 10). The microcomputer then proceeds to steps 9 through 11 in succession which are similar to the previous steps 4 to 6, and involve detecting a count which is a measure of the signal level of the high frequency test signal. In step 12 this count value is compared with the count previously stored 10 during computer in step 6 to determine whether the high frequency signal level is lower than the previously determined low frequency signal level. Computer 10 proceeds to step 13 during which the attenuator 11 loss is incremented by one discrete value. Computer 10 then returns to step 9 to repeat steps 9 to 12 until a match between the two count values is detected. If a match is detected computer 10 proceeds to step 14 to terminate the process and reset attenuator 16 to the latest value which occurs in response to the detection of the match. This allows reproduction of a high frequency audio signal typically at 8 kHz at or near level 55 in FIG. 10 which is a crosspoint of the 1 kHz and 8 kHz characteristic curves.

Figure 7:
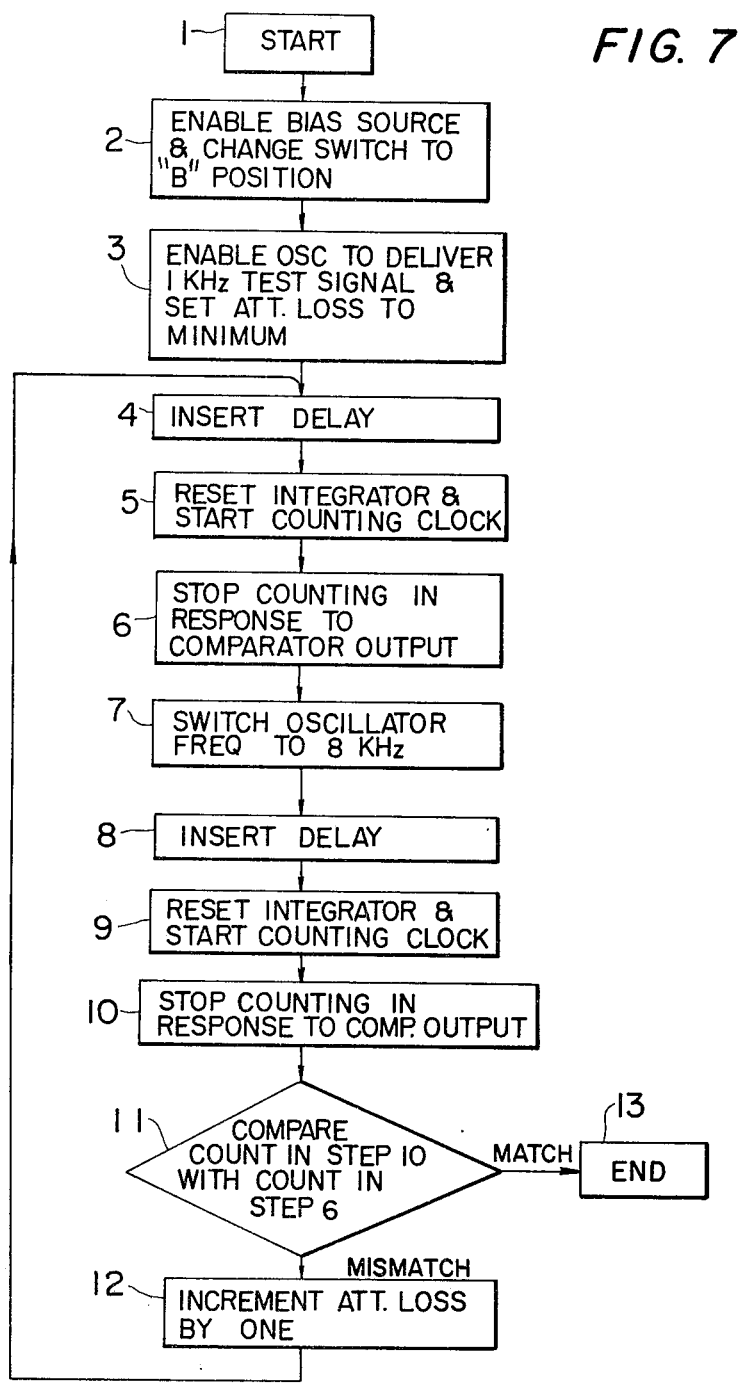

The test procedure illustrated in FIG. 7 is preferred for purposes of achieving precise coincidence between the levels of low and high frequency test signals. In this procedure low and high test signals are successively recorded with the same bias level which is then successively decreased to record a pair of counts for the reproduced test signals until there is a match between the two counts. Steps 1 and 2 are similar to steps 1 and 2 of FIG. 6. In step 3, the oscillator 3 is enabled to deliver a 1 kHz test signal and then the attenuator 16 is adjusted to a minimum loss to allow the low frequency test signal to be recorded with a maximum bias. A delay time inserted in step 4 is followed by step 5 during which integrator 42 commences integration at the termination of the delay period simultaneously with starting of clock pulse counting. The counting is terminated in step 6 in response to the comparator 46 output so at the completion of step 6 there is stored a count value associated with the time required for the output of integrator 42 to reach the value of Vref. In step 7 the computer 10 switchs the oscillator 12 frequency to 8 kHz. Steps 8 through 10 are similar to the previous steps 4 to 6 to store the count representing the high frequency test signal level. In step 11 computer 10 makes a comparison between the counts stored in steps 6 and 10 to detect a match between them. If there is a mismatch, computer 10 proceeds to step 12 wherein the attenuator 16 is incremented by one discrete amount to thereby decrease the bias level. Computer 10 then returns to step 4 to repeat the above processes so that the bias level is decreased in succession until the computer detects a match between the counts stored in steps 6 and 10, whereupon the computer goes to step 13 to end the test procedure. Then computer 10 holds the attenuator 16 level to the latest value which is provided in the step 11 of the latest occurrence.

In the procedures illustrated in FIGS. 6 and 7, the high-pass filter 28 has no particular function, so it can be dispensed with in so far as the procedures of FIGS. 6 and 7 are concerned.

Figure 8:
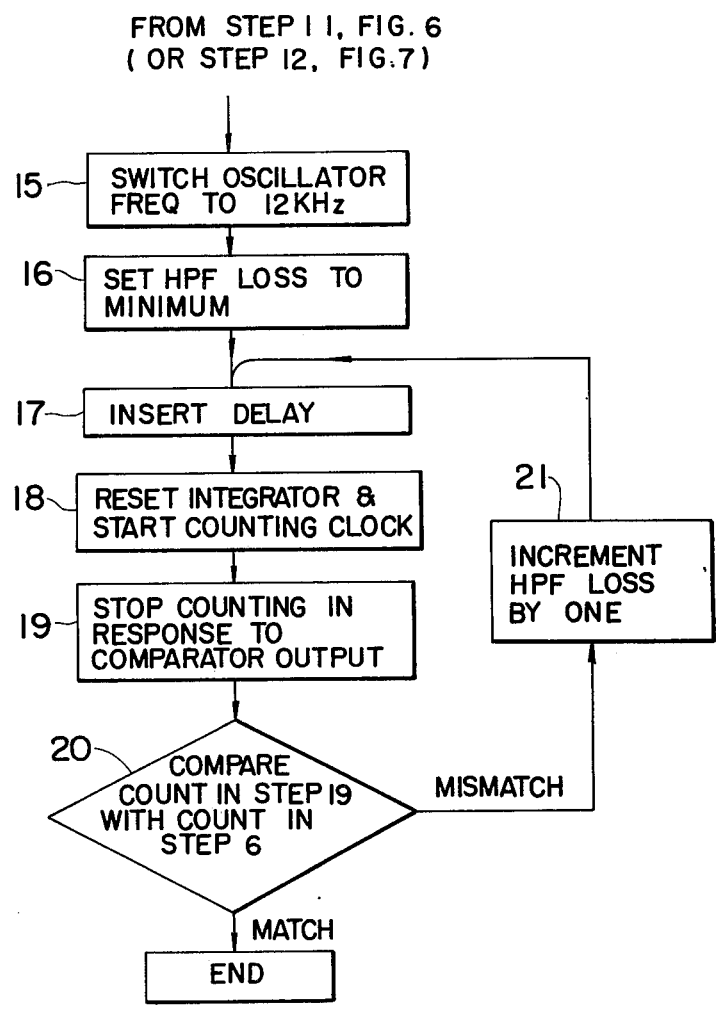

FIG. 8 is an illustration of another flow chart associated with the embodiment of FIG. 2 in which the variable loss high-pass filter 28 is controlled to perform a particular function. The same procedure is followed as in FIG. 6 or FIG. 7 with the exception that in step 7 the oscillator 12 frequency is changed to a medium frequency typically at 5 kHz rather than to 8 kHz, so that prior to proceeding to step 15 of FIG. 8 the low and medium frequency test signals are adjusted to the same level; this step 15 of FIG. 8 corresponds to steps 14 and 13 of FIGS. 6 and 7, respectively. In step 15 the oscillator 12 frequency is switched to a high frequency typically at 12 kHz and in step 16 the high-pass filter 28 is adjusted to a minimum loss to record the high frequency test signal at a minimum level, which is reproduced at the termination of a delay time introduced by step 17. The delay time of step 17 allows integrator 42 to commence integration (step 18) and start counting clock pulses. The counting operation is terminated in step 19 immediately following a signal from the comparator 46 which commands the count value to be stored. This count value is compared in step 20 with the count stored in step 6 (or step 11 of FIG. 6, or step 10 of FIG. 7) to detect a match between them. When mismatch is detected, step 21 is followed to increment the high-pass filter loss by one discrete value and the computer 10 then returns to step 17 to repeat the above process until it detects a match in step 20, so that the high-pass filter loss is adjusted to the latest value that provides the match. Therefore, low, medium and high frequency test signals are adjusted in amplitude to the same level by means of the variable attenuator 16 and high-pass filter 28 which remain adjusted to their respective setting values to enable recording of audio signal during subsequent recording operations with a flat frequency response characteristic.

Figure 3:
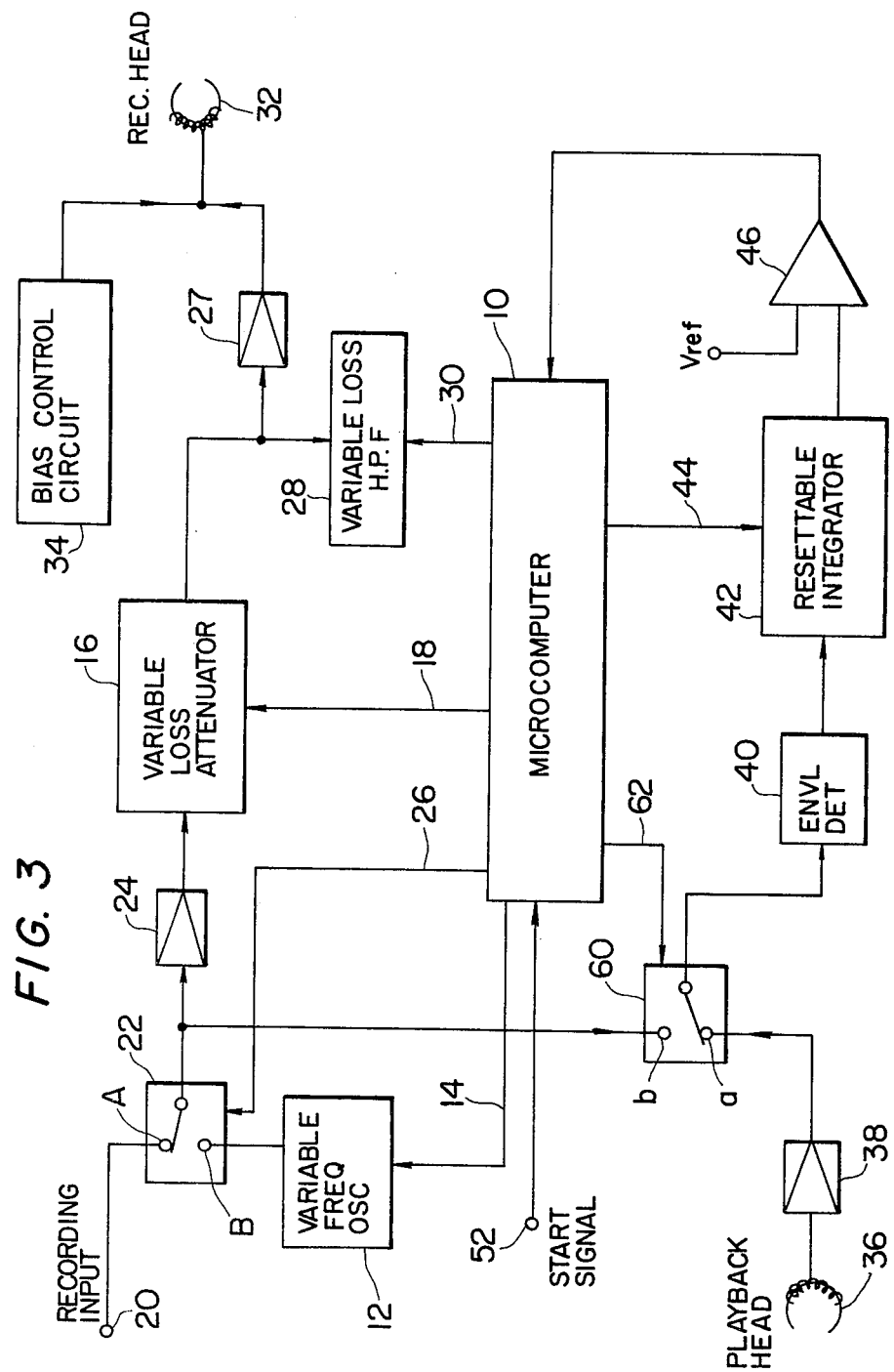
FIG. 3 is a schematic diagram of a modification of the first embodiment.

In the previous embodiments, the preset digital value is stored previously in the microcomputer 10 to enable a comparison to be made with the reproduced test signal. However, the reproduced test signal is passed through the amplifier 38, envelope detector 40 and resettable integrator 42 prior to the comparison. The operating characteristics of amplifier 38, detector 40 and integrator 42 have a tendency to vary under the influence of ambient temperature. Therefore, the stored preset value is not necessarily an accurate representation of the reference value. Another embodiment illustrated in FIG. 3 provides temperature compensation. The FIG. 3 embodiment is similar in circuit configuration to that shown in FIG. 1 with the exception that a second changeover switch 60 is provided which, prior to the recording operation applies the test signal to the envelope detector 40 to establish a reference level with which the reproduced test signal is compared.

Figure 9:
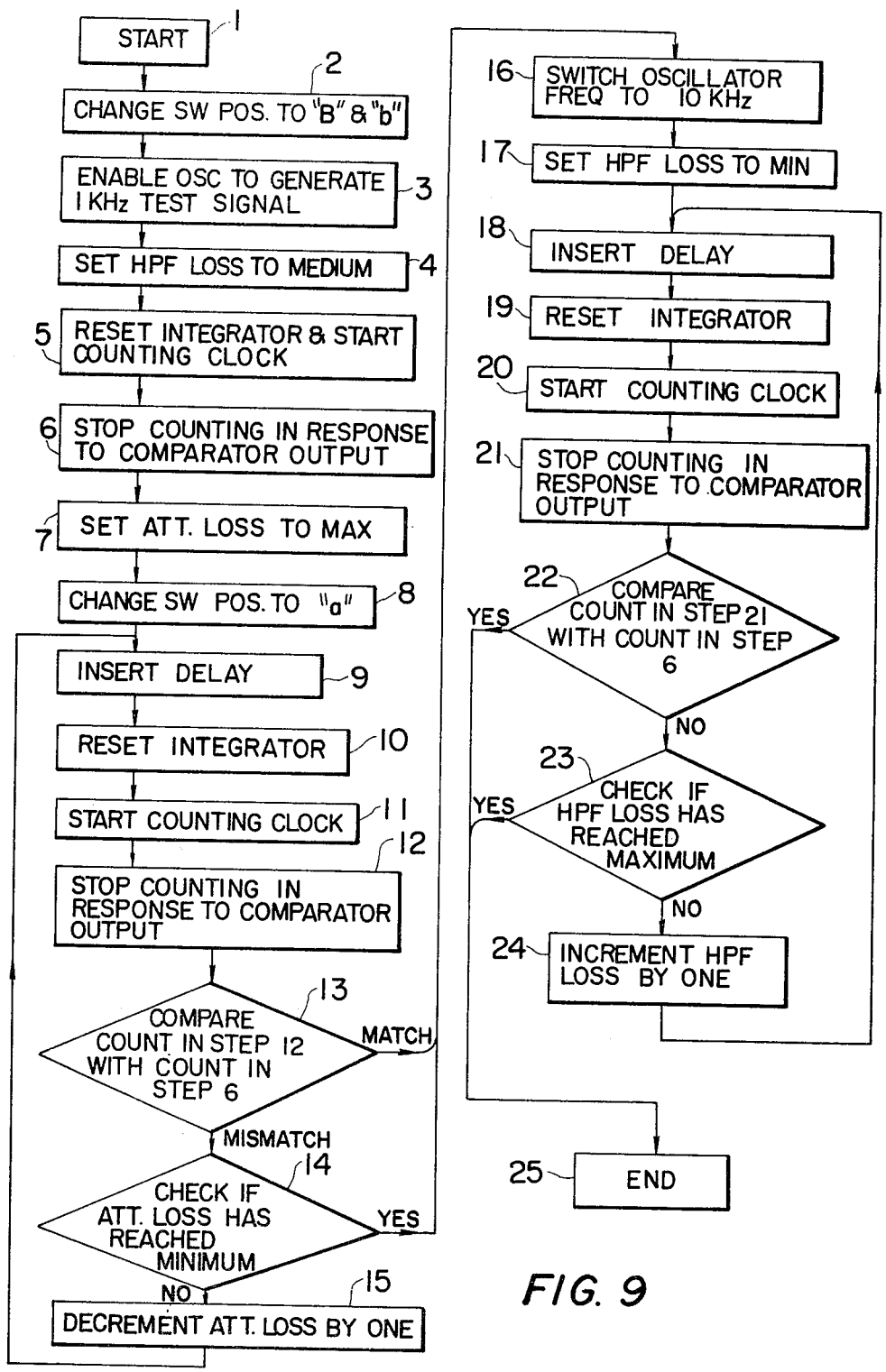
FIG. 9 is a flow chart associated with the FIG. 3 embodiment.

The operation of the FIG. 3 embodiment is visualized with reference to the flow chart shown on FIG. 9. Upon receipt of test mode signal on terminal 52, the microcomputer 10 delivers command signals, in step 2, to the switches 22 and 60 through lines 26 and 62; the command signals activate switches 26 and 62 so the contacts thereof are changed to positions B and b, respectively. In step 3, the frequency of the oscillator 12 is switched to 1 kHz which is applied through switches 22 and 60 to the envelope detector 40 and thence to the integrator 42. In step 4 the computer 10 sets the high-pass filter loss to a medium point then the computer proceeds to step 5 to reset the integrator 42 to enable integration of the 1 kHz test signal and enable counting of clock pulses. The output signal from the comparator 46 stops the counting operation in step 6 to permit the computer to store a count value thus representing a reference. In step 7 the attenuator 16 is adjusted to have a maximum loss to feed a minimum level 1 kHz test signal through highpass filter 28 to the recording head 32. In step 8 the computer 10 switches the switch 60 to the a position preparatory to feeding the reproduced 1 kHz test signal to the envelope detector 40. The computer 10 introduces a delay period in step 9 and resets the integrator 42 in step 10 to enable integration of the reproduced 1 kHz signal and starts counting clock pulses in step 11. In step 12 the counting operation is terminated in response to the comparator output and in step 13 the count reached in step 12 is compared with the reference count stored in step 6 to determine correspondence between them. The computer 10 actions performed in steps 9 to 13 correspond respectively to steps 6 to 10 of FIG. 4. The steps that follow after step 13 now correspond respectively to steps 11 to 22 of FIG. 4.

In FIG. 3, the test signal used to establish the reference is derived from the input terminal of amplifier 24. However, this signal may also be obtained from anywhere in the circuit between the input of amplifier 24 to the input of the recording head 32.

The temperature compensating effect of the FIG. 3 embodiment is particularly advantageous when the amplifiers 24 and 38 are provided with a Dolby noise reduction system in which the high frequency audio signal of small amplitude undergoes a reduced amplification upon recording and upon reproduction it undergoes a greater amplification (compression-expansion characteristics).

If the system is provided with the noise reduction feature, the circuits that effect amplitude compression and expansion should preferably be disabled during the test period.

Figure 11:
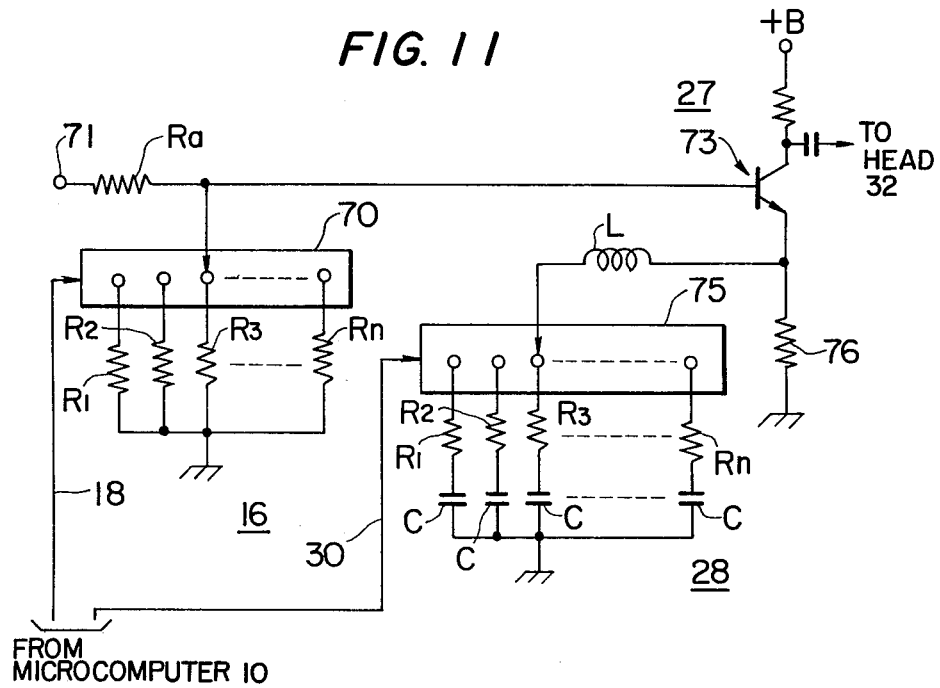
FIG. 11 is a circuit diagram of the variable loss attenuator and variable loss highpass filter of the embodiments of FIGS. 1 to 3.

FIG. 11 is a circuit diagram of details of the variable loss attenuator 16, variable loss highpass filter 28 and amplifier 27. The attenuator 16 comprises a multiplexer 70 and a plurality of resistance elements R1 to Rn which are connected selectively to a wiper terminal to which the input signal from amplifier 24 is coupled through a resistor Ra, to bypass the input signal to ground by an amount adjusted according to the digital signal supplied from the computer 10 on lead 18. Multiplexer 70 provides decoding of the input digital signal on lead 18 into a control signal that establishes a connection between the input terminal 71 and a desired resistance element. The amplifier 27 includes a transistor amplifier 73 having a base connected to the output of the attenuator 16, and an emitter connected through a resistor 76 to ground. Resistor 76 is in shunt with a highpass filter circuit comprised by an inductance element L, a multiplexer 75 and a plurality of series-connected resistor and capacitor networks. Each of these RC networks has a different resistance values and the same capacitance C which with the inductor L forms a high frequency tuned circuit. The multiplexer 75 is responsive to the digital signal from computer 10 to effect switching between the inductor 74 and a desired RC network so as to bypass a signal at a predetermined high frequency in the audio spectrum of different amplitude to ground.

The foregoing description is concerned with a tape recorder having separate recording and playback transducer heads. The present invention can also be applied to tape recorders having a single transducer which acts as a recording and playback head. In this case, the computer program should be changed so as to enable the tape recorder to rewind the tape after each test signal is recorded and then switch to the playback mode to reproduce the recorded signal.

What is claimed is:

1. A method for automatically providing a flat response to signals over the audio frequency spectrum based on the magnetic properties of a magnetic tape, comprising successively generating first and second audio test signals at different frequencies during a test period, recording said test signals in said tape, reproducing the recorded first and second test signals successively, sensing the level of the reproduced first and second signals, storing the sensed level of the first signal in a storage medium, comparing the sensed level of the second test signal with the stored level of the first test signal to detect the difference therebetween, adjusting the level of the recorded second test signal in accordance with the detected difference so as to reduce said difference substantially to zero, and holding the adjusted level of said second test signal during subsequent recording operation after said test period.

2. A method for automatically providing flat response to signals over the audio frequency spectrum utilizing the magnetic properties of a magnetic tape, comprising:
   (1) generating a first test signal at a first audio frequency and recording it in said magnetic tape;
   (2) reproducing the recorded first test signal;
   (3) varying a first level adjusting element based on the level of the reproduced first test signal until the recorded first test signal reaches a given level;
   (4) holding said first level adjusting element at the latest value which occurs at the instant said given level is reached;
   (5) generating a second test signal at a second frequency and recording it in said tape;
   (6) reproducing the recorded second test signal;
   (7) varying a second level adjusting element based on the level of the reproduced second test signal until the recorded second test signal reaches said given level; and
   (8) holding said second level adjusting element at the latest value which occurs at the instant the lastmentioned given level is reached.

3. A method as claimed in claim 2 wherein said given level is generated by the steps comprising:
   (9) detecting the level of the first test signal generated in the step (1); and
   (10) storing the level of the first test signal detected in the step (9) in a storage medium to represent said given level.

4. A method for automatically providing a flat response to signals over the audio frequency spectrum utilizing the magnetic properties of a magnetic tape, comprising:
   (1) generating a low frequency audio test signal and recording it in said tape;
   (2) generating an ultrasonic frequency bias signal and superimposing it on said recorded low frequency test signal;
   (3) reproducing the recorded signals to detect the level of the recorded low frequency test signal;
   (4) varying a level adjusting element to adjust the level of said bias signal until the reproduced low frequency test signal reaches a given level;
   (5) storing the level of said reproduced low frequency test signal in a storage medium;
   (6) generating a high frequency test signal and recording it in said tape;
   (7) superimposing said bias signal on said recorded high frequency test signal;
   (8) reproducing the recorded signals to detect the level of the reproduced high frequency test signal;
   (9) comparing the detected level of the high frequency test signal with the stored level to detect the difference therebetween;
   (10) varying said level adjusting element to adjust said bias level until said difference is reduced substantially to zero; and
   (11) holding said level adjusting element at the latest value which occurs in response to said difference being reduced substantially to zero.

5. A method for automatically providing a flat response to signals over the audio frequency spectrum utilizing the magnetic properties of a magnetic tape, comprising:
   (1) generating a low frequency audio test signal and recording it in said tape;
   (2) generating an ultrasonic frequency bias signal and superimposing it on said recorded low frequency test signal;
   (3) reproducing the recorded signals to detect the level of the recorded low frequency test signal;
   (4) storing the detected level of said low frequency test signal in a storage medium;
   (5) generating a high frequency audio test signal and recording it in said tape;
   (6) superimposing said bias signal on the recorded high frequency test signal;
   (7) reproducing the recorded signals to detect the level of the recorded high frequency test signal;
   (8) comparing the detected level of the high frequency test signal with said stored level to detect a match therebetween;
   (9) varying a level adjusting element by a discrete amount to vary the level of said bias signal by a discrete value when said match is not detected in the step (8);
   (10) repeating the steps (1) to (9) until a match is detected in the step (8); and
   (11) holding said level adjusting element at the latest value which occurs in response to said match being detected in the step (8).

6. A system for use with a tape recorder for automatically providing a flat response to signals over the audio frequency spectrum, comprising:
   a variable frequency test signal source for successively generating first and second test signals at different frequencies for application to a transducer head of the tape recorder;

means for adjusting the level of said audio test signals; and control means connected to be responsive to a signal derived from a transducer head of the tape recorder for varying said adjusting means in response to the test signals delivered from the head to sweep said recorded test signals from low to high levels until the reproduced test signals reach a reference level;

wherein said control means comprises a microcomputer which is programmed to provide the following steps:

(1) causing said test signal source to generate said first test signal;

(2) setting said adjusting means so that the first test signal is recorded at a minimum level;

(3) comparing the level of said reproduced first test signal with said reference level to detect the difference therebetween;

(4) resetting said adjusting means according to said difference so that said first test signal is recorded at said reference level;

(5) causing said test signal source to generate said second test signal;

(6) resetting said adjusting means so that the second test signal is recorded at a minimum level;

(7) comparing the level of said reproduced second test signal with said reference level to detect the difference therebetween; and (8) resetting said adjusting means according to said difference so that said second test signal is recorded at said reference level.

7. A system as claimed in claim 6, wherein each of the steps (4) and (8) comprises varying said adjusting means to increase the recorded signal level until said difference substantially reduces to zero.

8. A system for use with a tape recorder for automatically providing a flat response to signals over the audio frequency spectrum, comprising:

a variable frequency test signal source for successively generating first and second test signals at different frequencies for application to a transducer head of the tape recorder;

means for adjusting the level of said audio test signals; and control means connected to be responsive to a signal derived from a transducer head of the tape recorder for varying said adjusting means in response to the test signals delivered from the head to sweep said recorded test signals from low to high levels until the reproduced test signals reach a reference level;

wherein said adjusting means comprises first means for adjusting the level of the first test signal and second means for adjusting the level of the second test signal.

9. A system for use with a tape recorder for automatically providing a flat response to signals over the audio frequency spectrum, comprising:

a variable frequency test signal source for successively generating first and second test signals at different frequencies for application to a transducer head of the tape recorder;

means for adjusting the level of said audio test signals;

control means connected to be responsive to a signal derived from a transducer head of the tape recorder for varying said adjusting means in response to the test signals delivered from the head to sweep said recorded test signals from low to high levels until the reproduced test signals reach a reference level; and means connected to said test signal source for detecting the level of the first test signal and means storing the detected level of said first test signal to serve as said reference level.

10. A system for use with a tape recorder for automatically providing a flat response to signals over the audio frequency spectrum, comprising:

a variable frequency test signal source for selectively generating a low or high frequency audio test signal for application to a head means of said tape recorder;

a bias signal source for generating an ultrasonic frequency bias signal;

means for adjusting the bias level of said ultrasonic frequency signal for application to said head means to superimpose on said low or high frequency audio test signal;

a level detector connected to respond to an output signal of said head means of said tape recorder for detecting the level of the reproduced audio test signal;

a storage medium; and sequence control means including means for causing said test signal source to successively generate said low and high frequency test signals to thereby permit them to be successively recorded in a magnetic tape and detected by said level detector, means for causing the detected level of said low frequency test signal to be stored in said storage medium, means for comparing the detected level of said high frequency test signal with said stored level to detect the difference therebetween, and means for setting said level adjusting means according to said difference to adjust the bias level at a point at which said low and high frequency test signals have substantially the same signal level at the input of said head means.

11. A system as claimed in claim 10, wherein said sequence control means comprises a microcomputer which is programmed to provide the following steps:

(1) causing said test signal source to generate said low frequency test signal;

(2) setting said level adjusting means so that the bias level is adjusted to a minimum level and to permit said low frequency test signal to be recorded with said bias signal and subsequently detected by said level detector;

(3) causing the detected level of said low frequency test signal in said storage medium;

(4) causing said test signal source to generate said high frequency test signal to thereby permit it to be recorded with said bias signal at said minimum level and subsequently detected by said level detector;

(5) comparing the level of the high frequency signal detected in step (4) with the stored level to detect a match therebetween;

(6) resetting said level adjusting means to increment said bias level by a predetermined amount if a match is not detected; and (7) repeating the steps (1) to (6) until a match is detected in step (5).

12. A system for use with a tape recorder for automatically providing a flat response to signals over the audio frequency spectrum, comprising:

a variable frequency test signal source for selectively generating a low, medium and high frequency audio test signal for application to a head of said tape recorder;

a bias signal source for generating an ultrasonic frequency bias signal;

first level adjusting means connected to said bias signal source for supplying the level adjusted bias signal to said head;

second level adjusting means connected to said variable frequency test signal source for supplying to said head (1) the level adjusted high frequency test signal and (2) said low and medium frequency test signals without level adjustment;

a level detector connected to be responsive to an output signal of a head of said tape recorder for detecting the level of the reproduced audio test signal;

a storage medium; and sequence control means for causing said test signal source to successively generate said low, medium and high frequency test signals to thereby permit them to be recorded in a magnetic tape and subsequently detected by said level detector, means for causing the detected level of said low frequency test signal to be stored in said storage medium, means for comparing the detected level of said medium frequency signal with said stored level to detect the difference therebetween, means for setting said first level adjusting means according to said difference to adjust the bias level at a point at which said low and medium frequency test signals have substantially the same level at the input of a head, means for comparing the detected level of said high frequency signal with said stored level to detect the difference therebetween, and setting said second level adjusting means according to the last-mentioned difference to adjust the signal level of said high frequency test signal at the same level as said low and medium frequency test signals.

13. A magnetic recording and reproducing system comprising:

first audio frequency test signal recording means for recording the signal on a recording medium and successively reproducing the recorded signal;

second audio frequency test signal recording means for recording the signal on said recording medium in response to the reproduction of said first test signal and successively reproducing the recorded second test signal;

means for detecting the amount of deviation of each of said reproduced first and second test signals from a reference level;

first adjusting means for adjusting the level of said first test signal prior to recording in accordance with the amount of deviation of said reproduced first test signal from said reference level; and second adjusting means for adjusting the level of said second test signal prior to recording in accordance with the amount of deviation of said reproduced second test signal from said reference level.

14. A magnetic recording and reproducing system as claimed in claim 13, wherein said detecting means comprises:

a resettable integrator responsive to each of said reproduced test signals for generating respective ramp signals having a slope dependent on the envelope levels of the reproduced test signal in response to a reset signal applied thereto;

means for detecting the instant when the respective ramp signals reach a predetermined level;

means for measuring the length of time between said detected instant and the instant said integrator is reset; and means for detecting a match and mismatch between the measured length of time and a preset time length to cause said first and second test signal adjusting means to vary the level of the respective signals by the amount of a predetermined incremental value when said mismatch is detected until the time said match is detected.

15. A magnetic recording and reproducing system as claimed in claim 13, wherein said first audio frequency test signal recording means comprises a bias signal generating source for superimposing said bias signal on said first and second test signals prior to recording; and wherein said first adjusting means is receptive of said bias signal for adjusting the level of said bias signal in accordance with the amount of deviation of said first test signal from said reference level.

16. A magnetic recording and reproducing system as claimed in claim 13, wherein said first audio frequency test signal recording means comprises:

means for recording low and medium audio frequency test signals in succession on said recording medium and reproducing the signals successively; and a bias signal source for superimposing the bias signal on said low and medium frequency test signals prior to recording;

wherein said deviation detecting means and said first adjusting means comprises:

a resettable integrator responsive to each of the reproduced audio test signals for generating respective ramp signals having a slope dependent on the envelope levels of the reproduced test signals in reponse to a reset signal applied thereto;

means for measuring the length of time from the instant said integrator is reset to the instant each of said respective ramp signals reaches a predetermined level; and means for causing the level of said bias signal to vary from a given level until said reproduced low frequency test signal reaches said predetermined level to thereby cause said time measuring means to measure the time length associated with said low frequency test signal and repeatedly causing the level of said bias signal to vary from said given level until the measured time length associated with said medium frequency test signal has the same measured time length associated with said low frequency test signal;

wherein said second audio frequency test signal recording means comprises means for recording a high audio frequency test signal on said recording medium when said measured time length associated with said medium frequency test signal has the same measured time length associated with said low frequency test signal in superimposition with said bias signal and reproducing the signal; and wherein said second adjusting means comprises:

means for causing the level of said high frequency test signal to vary from a given level until the measured time length associated with said high frequency test signal has the same measured time length associated with said low frequency test signal.

17. A magnetic recording and reproducing system as claimed in claim 13, wherein said second audio frequency test signal recording means includes means for recording the second test signal in succession to said first test signal and reproducing the recorded second signal in succession to said first test signal.

18. A magnetic recording and reproducing system as claimed in claim 17, wherein said detecting means comprises:
a resettable integrator responsive to each of said reproduced test signals for generating first and second ramp signals in response to a reset signal applied thereto;
means for measuring the length of time from the instant said integrator is reset to the time each of said first and second ramp signals reaches a predetermined level;
first means for detecting a match and mismatch between the measured length of time associated with said first ramp signal and a preset time length to cause said first test signal adjusting means to discretely vary the level of the first test signal prior to recording when said mismatch is detected and until said match is detected; and
second means responsive to said first detecting means for detecting a match and mismatch between the measured length of time associated with said second ramp signal and said preset time length to cause said second test signal adjusting means to discretely vary the level of said second test signal prior to recording when said mismatch is detected and until the last-mentioned match is detected.

19. A magnetic recording and reproducing system as claimed in claim 18, further comprising switching means for applying said first test signal to said resettable integrator prior to recording to cause said time measuring means to measure the length of time it takes for an output signal of said integrator to reach said predetermined level to serve as said preset time length and successively applying said first reproduced test signal to said resettable integrator.

20. A magnetic recording and reproducing system comprising:
means for generating first and second audio frequency test signals in succession;
means for recording said test signals on a recording medium and reproducing the signals;
first means for varying the level of said first test signal from a first level toward a second level prior to recording;
means for detecting when the reproduced first test signal reaches a predetermined level to stop the variation of said first test signal;
second means for varying the level of said second test signal prior to recording from a first level toward a second level in response to the stopping of said variation of the frist test signal; and
means for detecting when the reproduced second test signal reaches said predetermined level to stop the variation of said second test signal.

21. A method for automatically providing a flat frequency response characteristic despite different magnetic properties of recording mediums, comprising the steps of:
generating a first audio frequency test signal;
varying the level of said first test signal from a first level toward a second level;
recording said first test signal on the recording medium;
reproducing the recorded signal;
detecting when the reproduced first test signal reaches a predetermined level;
stopping the variation of said first test signal in response to the detected reproduced first signal reaching the predetermined level;
generating a second audio frequency test signal;
varying the level of said second test signal from a first level toward a second level;
recording said second test signal on the recording medium;
reproducing the recorded second test signal;
detecting when the reproduced second test signal reaches said predetermined level; and
stopping the variation of said second test signal in response to the detected reproduced second signal reaching the predetermined level.

* * * * *